US010134926B2

United States Patent
Akkaya et al.

(10) Patent No.: US 10,134,926 B2
(45) Date of Patent: Nov. 20, 2018

(54) QUANTUM-EFFICIENCY-ENHANCED TIME-OF-FLIGHT DETECTOR

(71) Applicant: Microsoft Technology Licensing, LLC, Redmond, WA (US)

(72) Inventors: Onur Can Akkaya, Palo Alto, CA (US); Satyadev Nagaraja, San Jose, CA (US); Tamer Elkhatib, San Jose, CA (US); Cyrus Bamji, Fremont, CA (US); Swati Mehta, Palo Alto, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/755,306

(22) Filed: Jun. 30, 2015

(65) Prior Publication Data
US 2016/0225922 A1    Aug. 4, 2016

Related U.S. Application Data

(60) Provisional application No. 62/111,515, filed on Feb. 3, 2015.

(51) Int. Cl.
*H01L 31/0232* (2014.01)
*G01S 17/32* (2006.01)
(Continued)

(52) U.S. Cl.
CPC ........ *H01L 31/02327* (2013.01); *G01S 7/481* (2013.01); *G01S 17/32* (2013.01);
(Continued)

(58) Field of Classification Search
None
See application file for complete search history.

(56) References Cited

U.S. PATENT DOCUMENTS 3,889,284 A   6/1975  Schiel
5,796,118 A   8/1998  Morikawa et al.
(Continued)

FOREIGN PATENT DOCUMENTS

EP   1622200 A1   2/2006
EP   2216818 A2   8/2010
(Continued)

OTHER PUBLICATIONS

El Gamal, A. et al., "CMOS Image Sensors. An Introduction to the Technology, Design, and Performance Limits, Presenting Recent Developments and Future Directions", In IEEE Circuits and Devices Magazine, vol. 21, Issue 3, May 2005, 15 pages.
(Continued)

*Primary Examiner* — Benjamin Sandvik
(74) *Attorney, Agent, or Firm* — Alleman Hall Creasman & Tuttle LLP

(57) ABSTRACT

A time-of-flight detector includes a semiconductor layer and a light modulation structure. The semiconductor layer is configured to translate light radiation into electrical charge. The light modulation structure is configured to increase a path of interaction of light radiation through the semiconductor layer. In some example implementations, the light modulation structure is configured to deflect at least some light radiation at an increased angle through the semiconductor layer. In some example implementations, the light modulation structure is configured to reflect light radiation more than once through the semiconductor layer.

20 Claims, 7 Drawing Sheets

(51) Int. Cl.
  *G01S 7/481* (2006.01)
  *H01L 31/028* (2006.01)
  *H01L 27/146* (2006.01)

(52) U.S. Cl.
  CPC ...... *H01L 27/1463* (2013.01); *H01L 27/1464* (2013.01); *H01L 27/14603* (2013.01); *H01L 27/14612* (2013.01); *H01L 27/14625* (2013.01); *H01L 27/14629* (2013.01); *H01L 27/14643* (2013.01); *H01L 27/14685* (2013.01); *H01L 27/14689* (2013.01); *H01L 31/028* (2013.01); *H01L 27/14627* (2013.01)

(56) References Cited

U.S. PATENT DOCUMENTS

| | | | |
|---|---|---|---|
| 6,055,262 A * | 4/2000 | Cox | H01L 31/0232 257/E31.128 |
| 6,303,963 B1 | 10/2001 | Ohtani et al. | |
| 6,515,740 B2 | 2/2003 | Bamji et al. | |
| 6,532,061 B2 | 3/2003 | Ortyn et al. | |
| 6,580,496 B2 | 6/2003 | Bamji et al. | |
| 6,723,622 B2 | 4/2004 | Murthy et al. | |
| 6,906,793 B2 | 6/2005 | Bamji et al. | |
| 6,909,162 B2 | 6/2005 | Wu et al. | |
| 6,987,268 B2 | 1/2006 | Kuijk et al. | |
| 7,071,076 B2 | 7/2006 | Liu | |
| 7,153,720 B2 | 12/2006 | Augusto | |
| 7,242,043 B2 | 7/2007 | Ohkawa | |
| 7,276,749 B2 | 10/2007 | Martin et al. | |
| 7,352,454 B2 | 4/2008 | Bamji et al. | |
| 7,439,155 B2 | 10/2008 | Mouli et al. | |
| 7,464,351 B2 | 12/2008 | Bamji et al. | |
| 7,498,650 B2 | 3/2009 | Lauxtermann | |
| 7,973,377 B2 | 7/2011 | King et al. | |
| 7,994,465 B1 | 8/2011 | Bamji et al. | |
| 8,063,959 B2 | 11/2011 | Uya | |
| 8,314,924 B2 | 11/2012 | Bamji et al. | |
| 8,368,130 B2 | 2/2013 | Ko et al. | |
| 8,482,093 B2 | 7/2013 | Tian et al. | |
| 8,581,174 B2 | 11/2013 | Dai et al. | |
| 8,664,739 B2 | 3/2014 | King et al. | |
| 8,698,084 B2 | 4/2014 | Jiang et al. | |
| 8,988,661 B2 | 3/2015 | Hills et al. | |
| 2006/0001043 A1 | 1/2006 | Shim | |
| 2006/0128087 A1 | 6/2006 | Bamji et al. | |
| 2007/0085114 A1 * | 4/2007 | De Rossi | H01L 31/0236 257/290 |
| 2007/0252132 A1 * | 11/2007 | Kamins | B82Y 20/00 257/13 |
| 2009/0008735 A1 | 1/2009 | Ogino et al. | |
| 2009/0116720 A1 | 5/2009 | Ritman | |
| 2009/0272880 A1 * | 11/2009 | Stanton | H01L 27/14629 250/208.1 |
| 2010/0006908 A1 | 1/2010 | Brady | |
| 2011/0101482 A1 | 5/2011 | Meynants | |
| 2011/0181936 A1 | 7/2011 | Cho et al. | |
| 2011/0198481 A1 | 8/2011 | Kim et al. | |
| 2011/0220971 A1 * | 9/2011 | Haddad | H01L 27/14623 257/228 |
| 2011/0315988 A1 | 12/2011 | Yu et al. | |
| 2012/0001075 A1 | 1/2012 | Frach et al. | |
| 2012/0146172 A1 * | 6/2012 | Carey | H01L 27/14629 257/443 |
| 2012/0162380 A1 | 6/2012 | Cho et al. | |
| 2012/0267694 A1 | 10/2012 | Kaiser et al. | |
| 2012/0273910 A1 | 11/2012 | Hochschulz et al. | |
| 2012/0279553 A1 * | 11/2012 | Shigeta | H01L 31/035281 136/246 |
| 2012/0313204 A1 * | 12/2012 | Haddad | H01L 27/1462 257/432 |
| 2012/0326122 A1 | 12/2012 | Fujii et al. | |
| 2013/0119234 A1 | 5/2013 | Lee et al. | |
| 2013/0134535 A1 | 5/2013 | Lenchenkov | |
| 2013/0170011 A1 | 7/2013 | Cho et al. | |
| 2013/0181312 A1 | 7/2013 | Hoenk | |
| 2013/0207168 A1 | 8/2013 | Edwards et al. | |
| 2013/0334640 A1 | 12/2013 | Lee | |
| 2014/0138785 A1 * | 5/2014 | Pralle | H01L 27/14629 257/432 |
| 2014/0246713 A1 | 9/2014 | Wu et al. | |
| 2014/0253781 A1 | 9/2014 | Gill et al. | |
| 2015/0001665 A1 * | 1/2015 | Kautzsch | H01L 31/0352 257/436 |
| 2016/0109224 A1 | 4/2016 | Thuries et al. | |

FOREIGN PATENT DOCUMENTS

| | | |
|---|---|---|
| KR | 20120085632 A | 8/2012 |
| WO | 2002049339 A2 | 6/2002 |

OTHER PUBLICATIONS

Moutaye, E. et al., "Design of a CMOS APD Array for a 3-D Camera Based on the Time of Flight Distance Measurement", In Proceedings of IEEE Instrumentation and Measurement Technology Conference, May 2010, 4 pages.

Koifman, V., "Image Sensors World", http://image-sensors-world.blogspot.in/2010_10_01_archive.html, Published Oct. 30, 2010, Accessed May 8, 2015, 22 pages.

Åberg, I. et al., "A Low Dark Current and High Quantum Efficiency Monolithic Germanium-on-Silicon CMOS Imager Technology for Day and Night Imaging Applications", In Proceedings of IEEE International Electron Devices Meeting, Dec. 2010, 4 pages.

Hossain, Q., "Design and Characterization of a Current Assisted Photo Mixing Demodulator for TOF based 3D CMOS Image Sensor", In PhD Dissertation of International Doctorate School in Information and Communication Technologies, Dec. 2010, 118 pages.

Kaufmann, R. et al., "Near Infrared Image Sensor with Integrated Germanium Photodiodes", In Journal of Applied Physics, vol. 110, Issue 2, Published Jul. 26, 2011, Downloaded Aug. 2, 2012, 7 pages.

Roels, et al., "Continuous Time-of-Flight Ranging Using a MEMS Diffractive Subwavelength Period Grating (de) Modulator", In IEEE Photonics Technology Letters, vol. 20, No. 22, Nov. 15, 2008, pp. 1827-1829.

Roels, et al., "A Dynamic Subwavelength Pitch Grating Modulator for Continuous Time-Of-Flight Ranging with Optical Mixing", In IEEE/LEOS International Conference on Optical MEMs and Nanophotonics, Aug. 11, 2008, pp. 176-177.

Hahne, Uwe, "Real-Time Depth Imaging", Retrieved on: Feb. 4, 2015, Available at: opus4.kobv.de/opus4-tuberlin/files/3360/hahne_uwe.pdf.

ISA European Patent Office, International Search Report and Written Opinion Issued in Application No. PCT/US2016/015866, dated May 6, 2016, WIPO, 9 Pages.

IPEA European Patent Office, Second Written Opinion Issued in PCT Application No. PCT/US2016/015866, dated Dec. 14, 2016, WIPO, 6 pages.

IPEA European Patent Office, International Preliminary Report on Patentability Issued in PCT Application No. PCT/US2016/015866, dated Mar. 22, 2017, WIPO, 7 Pages.

"A Ready reference Book of Chemical and Physical Data", In CRC Handbook of Chemistry and Physics, 2016, 10 Pages.

"International Search Report and Written Opinion Issued in PCT Application No. PCT/US2016/015865", dated May 11, 2016, 11 Pages.

"Final Office Action Issued in U.S. Appl. No. 14/788,235", dated Jan. 4, 2017, 20 Pages.

"Final Office Action Issued in U.S. Appl. No. 14/788,235", dated Jan. 31, 2018, 21 Pages.

"Non-final Office Action Issued in U.S. Appl. No. 14/788,235", dated Jul. 29, 2016, 22 Pages.

"Non-final Office Action Issued in U.S. Appl. No. 14/788,235", dated Sep. 7, 2017, 22 Pages.

"International Preliminary Report on Patentability Issued in PCT Application No. PCT/US2016/015865", dated Mar. 2, 2017, 6 Pages.

(56) References Cited

OTHER PUBLICATIONS

"Amendments issued in PCT Application No. PCT/US2016/015865", dated Jun. 16, 2016, 8 Pages.

* cited by examiner

QUANTUM-EFFICIENCY-ENHANCED TIME-OF-FLIGHT DETECTOR

CROSS REFERENCE TO RELATED APPLICATIONS

This application claims priority to U.S. Provisional Patent Application Ser. No. 62/111,515, entitled "TIME-OF-FLIGHT DETECTOR," filed Feb. 3, 2015, the entirety of which is hereby incorporated herein by reference.

BACKGROUND

A time-of-flight device may be configured to illuminate a scene with a modulated light source, and observe the reflected light. A phase shift between the illumination and the reflection may be measured and translated to a distance.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A time-of-flight detector includes a semiconductor layer and a light modulation structure. The semiconductor layer is configured to translate light radiation into electrical charge. The light modulation structure is configured to alter the propagation of the light radiation and increase a path of interaction of light radiation through the semiconductor layer. In some example implementations, the light modulation structure is configured to deflect at least some light radiation at an increased angle through the semiconductor layer. In some example implementations, the light modulation structure is configured to reflect light radiation more than once through the semiconductor layer.

DETAILED DESCRIPTION

As discussed above, a time-of-flight (TOF) device may produce a distance measurement derived from a phase shift between illumination light radiation (e.g., infrared light) produced by the time-of-flight device and reflection light radiation (e.g., reflected infrared light) received by the time-of-flight device. In particular, the time-of-flight device may include a time-of-flight detector that is configured to translate the reflected light radiation into an electrical charge or electrical signal that is used to determine the phase shift. Accordingly, an amount of uncertainty in the distance measurement may be sensitive to a signal-to-noise ratio (SNR) of the electrical charge produced by the time-of-flight detector. One way to increase signal is to increase a quantum efficiency (QE) of the time-of-flight detector. QE is the ratio of the number of charge carriers generated to the number of incident photons at a given energy.

The present disclosure relates to various approaches for increasing the quantum efficiency of a time-of-flight detector. For example, a time-of-flight detector may include various light modulation structures configured to increase a path of interaction of light radiation through a semiconductor layer of the time-of-flight detector. By increasing the path of interaction of light radiation, the semiconductor layer may absorb a greater amount of light radiation that may be translated to an increased signal. In other words, the light modulation structures may increases the QE of the time-of-flight detector.

Figure 1:
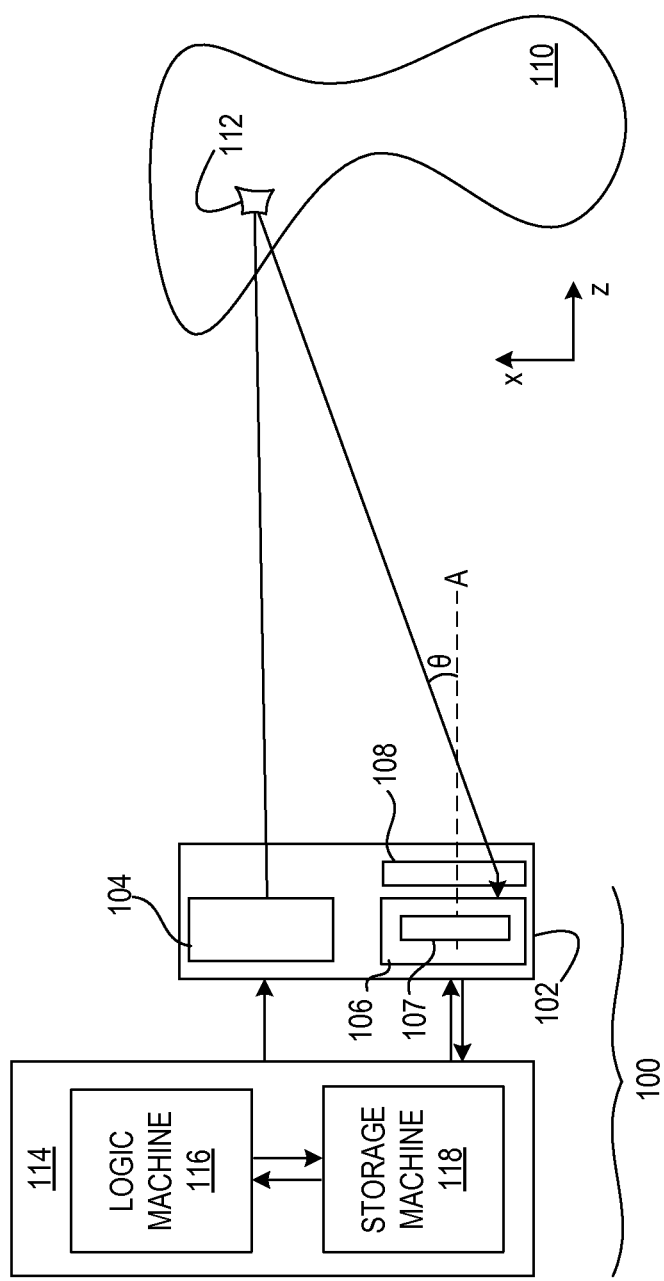
FIG. 1 shows an example machine-vision system.

Prior to discussing the various approaches and configurations for increasing QE of a time-of-flight detector, an example machine-vision system 100 is described with reference to FIG. 1. The machine-vision system 100 includes a time-of-flight depth camera 102. The machine-vision system 100 disclosed herein is capable of imaging a broad range of subjects, from simple, static topologies to complex, moving subjects such as human beings. In some scenarios, an imaged subject may include both foreground and background portions and constitute an entire scene.

The time-of-flight depth camera 102 includes a modulated light source 104, a time-of-flight detector (e.g., an imaging pixel array) 106, and an objective lens system 108. The time-of-flight depth camera 102 may also include various other components, such as a wavelength filter (not shown in the drawings) which may be set in front of the time-of-flight detector 106 and/or the objective lens system 108.

The modulated light source 104 may be configured to project onto a subject 110 modulated probe light of an infrared (IR) or near-infrared (NIR) wavelength band. The objective lens system 120, accordingly, may be transparent or at least highly transmissive in an IR or NIR band where the modulated light source emits. The probe light may be modulated temporally according to any suitable modulation waveform, including, but not limited to a pulsed or sinusoidal waveform. The nature of the modulated light source may differ in the various implementations of this disclosure. In some implementations, the modulated light source may include a modulated laser, such as an IR or NIR laser. More particular examples include an edge emitting laser or vertical-cavity surface-emitting laser (VCSEL). In other implementations, the modulated light source may include one or more high-power light-emitting diodes (LEDs).

The objective lens system 108 may be configured to receive the light reflected from the subject 110 and refract such light onto the time-of-flight detector 106. In some implementations, the objective lens system 108 may provide a relatively high field of view (FOV). In the illustrated implementation, the objective lens system 108 and the time-of-flight detector 106 share a common optical axis A, which is normal to the imaging pixel array and passes through a center of the lens system. The objective lens system 108 may be a compound lens system in some implementations. In more particular configurations, the objective lens system 108 may include five, six, or another number of refractive elements.

The time-of-flight detector 106 includes an array of depth-sensing pixels, each configured to receive at least some of the modulated probe light reflected back from a corresponding locus 112 of the subject 110. Each pixel of the array translates light radiation into electrical charge useable to determine the distance from the depth camera 102 to the subject locus 112 imaged onto that pixel.

The time-of-flight detector 106 includes a light modulation structure 107 configured to increase a path of interaction of light radiation (e.g., reflected probe light) through a semiconductor layer of the time-of-flight detector 106 to increase a QE of the time-of-flight detector 106.

A controller 114 of machine-vision system 100 is operatively coupled to the modulated light source 104 and to the time-of-flight detector 106, and is configured to compute the distance to the locus 112. The controller 114 includes a logic machine 116 and a storage machine 118. The controller 114 may be configured to provide synchronized, modulated drive signals to the light source 104 and to the time-of-flight detector 106, to synchronize the operation of these components. In particular, the controller 114 may be configured to modulate emission from the light source 104 while synchronously biasing the electrodes of the time-of-flight detector 106. Also, the controller 114 may be configured to read the output from each pixel of the time-of-flight detector 106 to enable computation of a depth map of the subject 110. As used herein, the terms 'depth map' or 'depth image' refer to an array of pixels registered to corresponding loci (Xi, Yi) of an imaged subject, with a depth value Zi indicating, for each pixel, the depth of the corresponding locus. 'Depth' is defined as a coordinate parallel to the optical axis A of the depth camera, which increases with increasing distance from the depth camera. In some implementations, repeated depth imaging may be used to assemble a time-resolved series of depth maps—i.e., depth video.

The machine-vision system 100 is provided as a non-limiting example, and other configurations may be employed. In some implementations, various components of the machine-vision system 100 may be different or omitted all-together.

As discussed above, a time-of-flight detector may include a light modulation structure configured to increase a path of interaction of light radiation through a semiconductor layer of the time-of-flight detector. FIGS. 2-13 show different example light modulation structures. Any such light modulation structures may be included, alone or in combination, in a time-of-flight detector.

Figure 2:
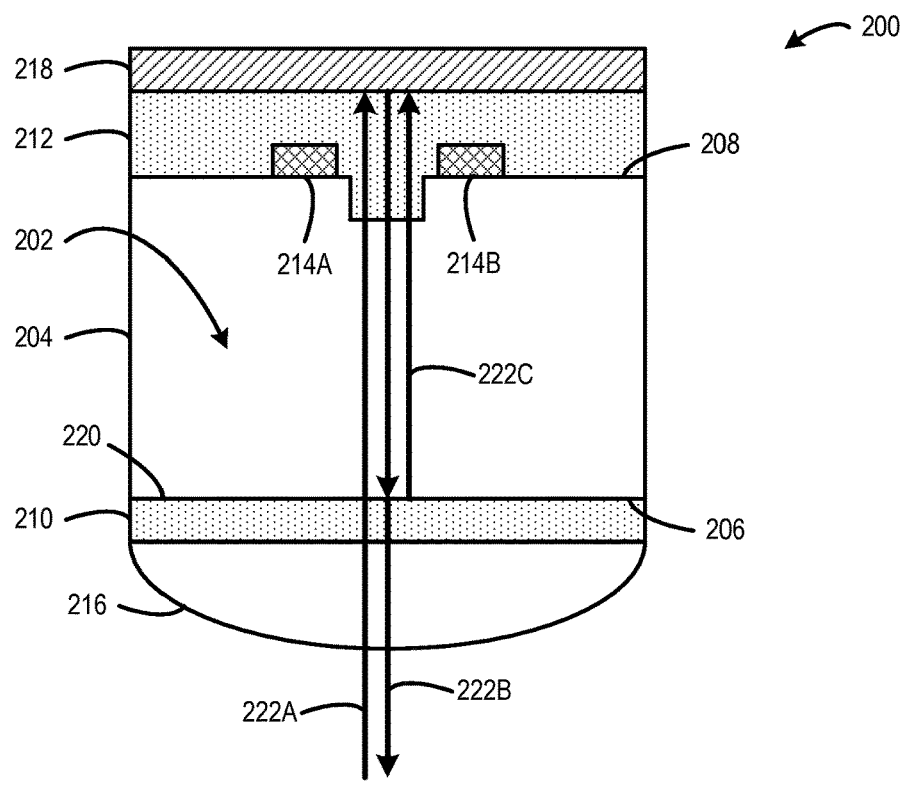
FIG. 2 shows an example a time-of-flight (TOF) detector including a resonant optical cavity.

FIG. 2 shows an example time-of-flight detector 200 including a resonant optical cavity 202. The time-of-flight detector 200 is shown in simplified form. The time-of-flight detector 200 may be one of numerous detectors employed in an imaging array.

In the illustrated example, the time-of-flight detector 200 is a complementary metal-oxide-semiconductor (CMOS) sensor constructed using the CMOS process. In particular, a semiconductor layer 204 may be configured to translate light radiation into electrical charge. The semiconductor layer 204 may include an input side 206 and a detector side 208 opposite the input side 206. In one example, the semiconductor layer 204 includes Silicon. In another example, the semiconductor layer 204 includes Germanium. Germanium may have a lower bandgap energy (0.67 eV) than Silicon (1.11 eV), and a higher absorption coefficient particularly at longer wavelengths. As such, Germanium may provide an increase in QE of the time-of-flight detector 200 relative to Silicon. Furthermore, by using Germanium in the semiconductor layer 214, the time-of-flight detector 200 may be operated at longer wavelengths relative to a Silicon. Such operation at longer wavelength may allow for increased performance in ambient light conditions. Also, by using Germanium in the semiconductor layer 214, the semiconductor layer 214 may be made thinner relative to Silicon, because Germanium has significantly higher absorption characteristics. The reduced thickness of the semiconductor layer 214 may be beneficial in terms of frequency of operation and modulation contrast. The semiconductor layer 204 may include any suitable material configured to translate light radiation into electrical charge.

An input-side dielectric layer 210 may be formed on the input side 206, and a detector-side dielectric layer 212 may be deposited on the detector side 208. The dielectric layers 210, 212 may electrically insulate the semiconductor layer 204. In one example, the dielectric layers 210, 212 are composed of silicon oxide ($SiO_2$) and silicon nitride. The dielectric layers 210, 212 may be other insulating material(s).

Gates 214 (e.g., 214A, 214B) may be deposited on the detector side 208 of the semiconductor layer 204. The gates 214 may be configured to be activated to allow electrical charge to flow from the semiconductor layer 204. In other words, when the gates 214 are activated, the time-of-flight detector 200 may output an electrical charge. In one example, the gates 214 include polysilicon. The gates 214 may be other suitable material(s).

Although the time-of-flight detector 200 is discussed in the context of the CMOS process, the concepts discussed herein may be broadly applicable to other configurations manufactured in other manners.

An optical element 216 may be positioned on the input side 206 of the semiconductor layer 204. In particular, the optical element 216 may be coupled to the input-side dielectric layer 210, such that the input-side dielectric layer 210 is positioned intermediate the optical element 216 and the semiconductor layer 204. The optical element 216 may be configured to direct input light radiation from the surrounding environment into the time-of-flight detector 200. In particular, the optical element 216 may be configured to focus and concentrate light onto the semiconductor layer 204.

In one example, the optical element 216 may include a microlens. For example, the microlens may be incorporated into an array of microlenses formed on a supporting substrate that is coupled to the input-side dielectric layer 210.

A reflector 218 may be positioned on the detector side 208 of the semiconductor layer 204. In particular, the reflector 218 may be coupled to the detector-side dielectric layer 212. The reflector 218 may be configured to reflect at least some light radiation that passes through the semiconductor layer 204 back into the semiconductor layer 204.

In one example, the reflector 218 may include one or more metal layers on the detector side 208. In some implementations, the one or more metal layers may additionally be used to route electrical signals between various components of the time-of-flight detector 200. The one or more metal layers can be grounded or biased to a desired voltage as required by the electrical operation of the time-of-flight detector 200. In one example, the reflector 218 may be configured to reflect light radiation across a large wavelength bandwidth. In one example, the reflector 218 may be completely reflective. In one particular example, the reflector 218 includes copper. In another example, the reflector 218 includes aluminum. The reflector 218 is located on the detector side 208 of the semiconductor layer 204 where the reflector 218 does not block light radiation from initially entering the time-of-flight detector 200.

Figure 3:
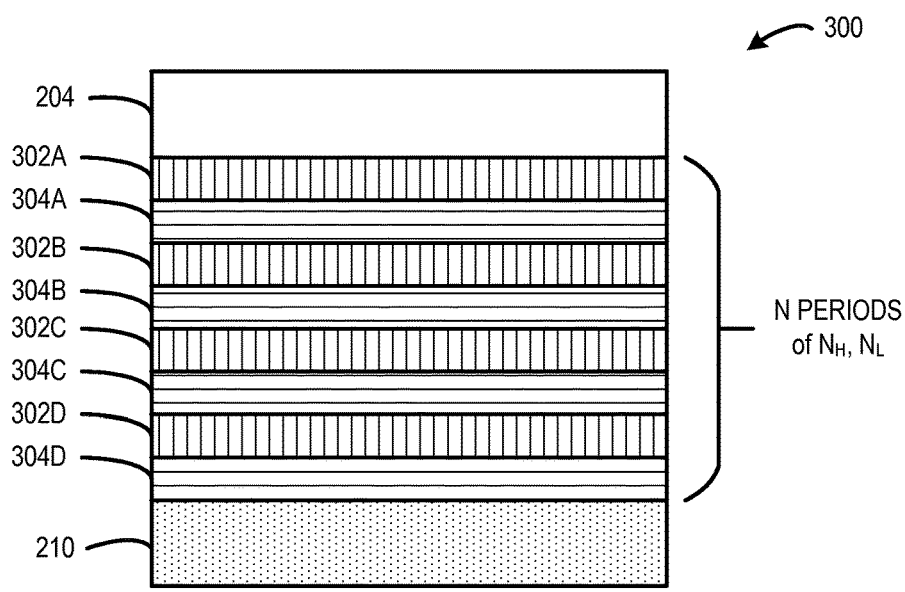
FIG. 3 shows an example distributed reflector that optionally may be included in the time-of-flight detector of FIG. 2.

In some implementations, the reflector 218 may include a reflective surface. For example, the reflector 218 may include an interface between two layers with different refractive indices (e.g., Silicon-Oxide and Oxide-Nitride) that reflect at least some light radiation. In another example, the reflector 218 may include a distributed reflector that includes multiple layers of alternating materials (e.g., high-index material and low-index material). An example of the distributed reflector is shown in FIG. 3. The reflectivity and the wavelength bandwidth of the distributed reflector may be based on the different refractive indexes of the alternating layers, and the thickness of the alternating layers. In another example, the reflector 218 may include a silicide layer positioned on the detector side 208 of the semiconductor layer 204 that reflects at least some light radiation. The reflector 218 may include any suitable reflective material or structure.

Furthermore, the reflector 218 and a light interface 220 between the input side 206 of the semiconductor layer 204 and the input-side dielectric layer 210 may define at least some boundaries of the resonant optical cavity 202. The resonant optical cavity 202 may be configured such that at least some light radiation resonates between the reflector 218 and the light interface 220. Each time light radiation traverses the resonant optical cavity 202, the semiconductor layer 204 may translate light radiation into electrical charge, and an interaction path through the semiconductor layer 204 may be extended. Moreover, each time light radiation traverses the resonant optical cavity 202, the light radiation may experience an optical phase delay. In one example, the optical phase delay of a light wave is a function of the interaction path length that is determined based on a refractive index and a thickness of materials that are included in the resonant optical cavity 202 (e.g., reflector 218, detector-side dielectric layer 212, semiconductor layer 204, and input-side dielectric layer 210). The resonant optical cavity 202 may produce multiple light wave interference that interfere constructively to increase absorption of light radiation at resonance wavelengths in the semiconductor layer 204.

In some implementations, a light modulation structure, e.g., a diffraction grating, may be configured to increase a bandwidth of light radiation resonating within the resonant optical cavity. In other words, a diffraction grating or other light modulation structure can be used to broaden the range of wavelengths that will constructively interfere to increase absorption of light radiation in the semiconductor layer. Such an increase could, for example, provide wider tolerances for the wavelengths of illumination light that can be effectively used for time-of-flight detection. As one example, an illumination laser may change wavelengths as the laser heats up with use, and the diffraction grating may be used to increase the effectiveness of the resonant optical cavity throughout this range of changing wavelengths.

The light interface 220 may strike a balance between initially allowing input light radiation to enter the semiconductor layer 204 and reflecting light radiation in the resonant optical cavity 202. In other words, the light interface 220 may be configured to transmit light radiation entering the resonant optical cavity 202, and reflect light radiation that would otherwise exit the resonant optical cavity 202.

In the illustrated example, input light radiation (e.g., ray 222A) is initially directed by the optical element 216 through the input-side dielectric layer 210. The light radiation passes through the light interface 220, the semiconductor layer 204, the detector-side dielectric layer 212, and is reflected by the reflector 218 back through the semiconductor layer 204 to the light interface 220. The light wave behavior may be such that some wavelengths (e.g., resonance wavelength) interfere constructively in the resonant optical cavity 202 and destructively outside the resonant optical cavity 202. On the other hand, other wavelengths may behave oppositely, such that the light waves may interfere destructively in the resonant optical cavity 202 and constructively outside the resonant optical cavity 202.

The resonance wavelength may be based on the refractive indexes of the different materials that form the light interfaces of the resonant optical cavity 202 (e.g., light interface 220) as well as the length of the resonant optical cavity 202. Furthermore, layers outside the resonant optical cavity 202 may change the reflection of light radiation back into the resonant optical cavity 202 that changes the peak absorption of the light radiation by the semiconductor layer 204. In one example, the resonance wavelength of the resonant optical cavity 202 may be particularly tuned to a wavelength of light radiation emitted by a light source (e.g., modulated light source 104) that emits the input light radiation directed into the time-of-flight detector 200.

In one example, the reflectivity of the light interface 220 may be determined by:

$Rb = Rfe^{\wedge}(-2\alpha L)$, where $\alpha$ is an absorption coefficient of the semiconductor layer 204, L is a thickness of the semiconductor layer 204, and Rf and Rb are the reflectivity of the boundaries of the resonant optical cavity 202. In the illustrated example, Rf corresponds to the reflector 218 and Rb corresponds to the light interface 220. The optimum reflectivity of the light interface 220 provides the highest absorption at the resonance wavelength.

Furthermore, a condition for resonance at a particular wavelength may be determined, for example, by:

$L = m\lambda/(2n)$, where n is the refractive index of the semiconductor layer 204, $\lambda$ is a wavelength, and m is an integer (1, 2, 3, . . . ). Therefore, a particular semiconductor layer thickness may result in a resonance at a particular wavelength for a given semiconductor layer material.

In some cases, the resonant optical cavity 202 may more effectively increase the QE of the time-of-flight detector 200 if the resonant optical cavity 202 has a resonance wavelength bandwidth that is sufficiently wide.

Accordingly, various process, system, and/or device level approaches may be performed to allow the resonant optical cavity 202 to have a sufficiently wide resonance wavelength bandwidth to increase the QE of the time-of-flight detector 200. In one example, at the process level, materials that are used in the different layers of the time-of-flight detector 200 may be selected based on fabrication tolerances (e.g., thickness). For example, a silicon-on-insulator type wafer may be selected for use in the time-of-flight detector 200, because such a wafer may provide a tighter Silicon thickness tolerance relative to other types of wafers.

In another example, at the process level, a statistical distribution of thicknesses of semiconductor layers of time-of-flight detectors on a wafer may be matched with a wavelength of light radiation emitted by associated light sources. Such an approach may yield a higher number of detectors per wafer whose resonance wavelength matches the wavelength of an associated light source.

In another example, at the system level, a light source may be selected for use with the time-of-flight detector 200 that emits light radiation at a stable wavelength even as an operating temperature varies. In one example, a vertical-cavity surface emitting laser (VCSEL) may be employed in conjunction with the time-of-flight detector 200, because the VCSEL may be thermally stable relative to other illumination sources.

In another example, at the system level, a light source may include tunable one or more laser diodes that can be used to track the resonance wavelength of a particular time of flight detector matched with the light source. For example, the wavelength of a tunable laser diode can be tuned via temperature adjustment.

In another example, the optical element 216 may be configured to modify the input light to produce a set of rays with different incidence angles into the semiconductor layer 204. These rays may traverse the semiconductor layer 204 at slightly different interaction path lengths, thus increasing the resonance bandwidth.

In another example, a diffraction grating may be incorporated into the optical element 216. The diffraction grating may modify the input light to create light beams with different angles that experience different optical path lengths in the semiconductor layer 204. Such different angles of the light beams may result in shifted resonance wavelengths increasing the overall resonance bandwidth.

Another factor that plays a role in resonance bandwidth is the laser linewidth, which represents the distribution of laser power over a band of wavelengths. Each wavelength in the laser's optical spectrum causes a slightly different resonance, resulting in a broader overall resonance.

Finally, in order to compensate for variations in the active layer thickness and/or laser wavelength, the time-of-flight detector 200 may include a tunable layer (e.g., using liquid crystals) in the CMOS stack. The refractive index or length of such a layer can be electrically tuned that can effectively change the optical path length light traverses, and hence tunes the resonance wavelength as desired.

In another example, the time-of-flight detector 200 may include a distributed reflector. FIG. 3 shows an example distributed reflector 300. The distributed reflector 300 may be positioned on the input side 206 of the semiconductor layer 204 between the semiconductor layer 204 and the input-side dielectric layer 210. In other words, the distributed reflector 300 may affect the refractive characteristics of the light interface 220. The distributed reflector 300 may include a plurality of layers of alternating high refractive index materials 302 (e.g., 302A, 302B, 302C, 302D) and layers of low refractive index materials 304 (e.g., 304A, 304B, 304C, 304D). Such a configuration may result in periodic variation in the effective refractive index of the distributed reflector 300. For example, each layer boundary may cause a partial reflection of light radiation in a different wavelength.

The distributed reflector 300 may include any suitable number of alternating layers 302 and 304. A reflectivity and wavelength bandwidth of the distributed reflector 300 may be based on the refractive index and the thickness of the alternating layers 302 and 304. Moreover, the wavelength bandwidth in which light radiation is reflected may be varied based on a number of periods of the alternating layers 302 and 304.

In some implementations, the time-of-flight detector 200 may include a distributed reflector on the detector side 208 of the semiconductor layer 204 in place of the reflector 218.

The resonant optical cavity 202 may be particularly applicable to increasing the QE of a time-of-flight detector, because a time-of-flight detector may be configured to absorb light radiation in a selected wavelength bandwidth that is associated with an illumination source, and the resonant optical cavity 202 may be designed to have a resonance that matches the selected wavelength bandwidth.

The features discussed with specific reference to FIG. 2 may be incorporated into the other implementations of this disclosure.

Figure 4:
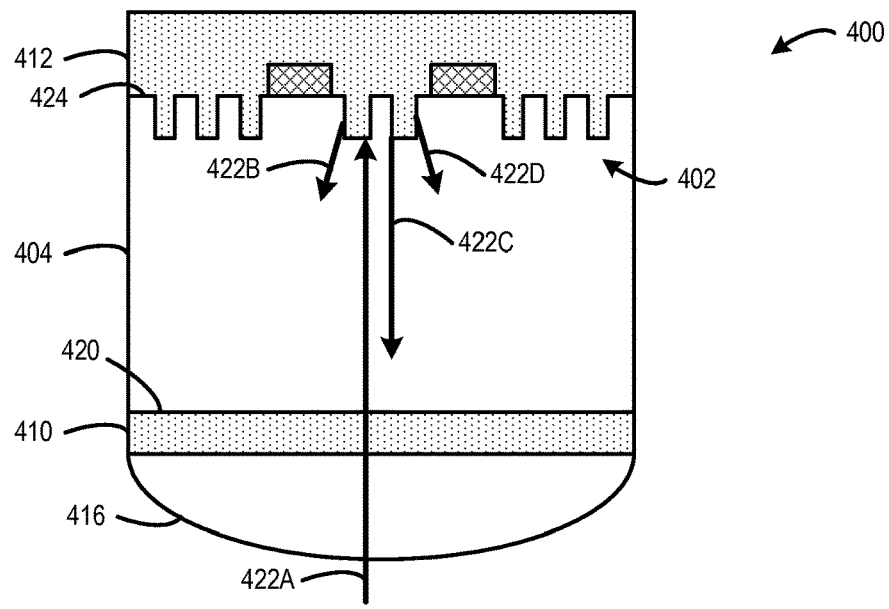
FIG. 4 shows an example time-of-flight detector including a diffraction grating.

FIG. 4 shows an example time-of-flight detector 400 including a diffraction grating 402 that may be incorporated into a light modification structure. Many components of the time-of-flight detector 400 may be substantially the same as those of the time-of-flight detector 200 and are described no further. The features discussed with specific reference to FIG. 4 may be incorporated into the other implementations of this disclosure.

The diffraction grating 402 may be configured to form a light interface 424 between the detector-side dielectric layer 412 and the semiconductor layer 404. The light interface 424 may have an index of refraction that varies according to a spatial period along the light interface 424. The light interface 424 may be configured to deflect light radiation at an increased angle through the semiconductor layer 404. In particular, such a structure may modulate an amplitude and optical phase of light radiation (e.g., an incident wave) that passes through the semiconductor layer to produce multiple portions of light radiation (e.g., waves) traveling at specific angles (e.g., diffracted orders 0, 1, −1). The angles of these different portions of light radiation may be based on the wavelength of the input light radiation (e.g., ray 422A), the refractive index of the light interface 424 (e.g., the refractive indices of the high-index semiconductor layer 404 and the low index dielectric layer 412), the periodicity of the refractive index of the diffraction grating 402, and the angle of incidence of the input light radiation (e.g., ray 422A). For example, a diffraction grating having a small period may create a large angular separation between resulting diffracted waves (or modes).

The light radiation that is directed into each diffracted mode may be governed by several factors. A first factor may include the shape of a single grating period of the diffraction grating 402. In an example implementation of a diffraction grating made by etching oxide trenches in Silicon, the depth of the oxide trenches and the shape of the trenches may determine a light radiation distribution in each diffracted mode. A second factor may include a duty cycle of the periodicity of the diffraction grating 402, which is a ratio of a feature dimension (trench width in the previous example) relative to the grating period.

After being diffracted by the diffraction grating 402, if an angle of incidence of the diffracted light on an interface between a high index material, such as Silicon, and low index material, such as Oxide, is above a critical angle (e.g. $\theta > \theta c = \arcsin(nOx/nSi)$), the diffracted light experiences total internal reflection. In the illustrated example, diffracted light that strikes the light interface 420 at an angle greater than the critical angle is reflected back into the semiconductor layer 404. Such total internal reflection may increase an interaction path length of light radiation inside the semiconductor layer 404, and thus increases the QE of the time-of-flight detector 400.

In the illustrated example, input light radiation (e.g., ray 422A) is initially directed by the optical element 416 through the input-side dielectric layer 410. The light radiation passes through the light interface 420, the semiconductor layer 404, and strikes the light interface 424 of the diffraction grating 402. The light interface 424 diffracts the light radiation into a plurality of different portions (or modes) having different angles. A first portion (e.g., ray 422B) is diffracted at a negative angle relative to an angle of incidence of the input light radiation, a second portion (e.g., 422C) is diffracted at an angle that is normal to the angle of incidence of the input light radiation, and a third portion (e.g., ray 422D) is diffracted at a positive angle relative to an angle of incidence of the input light radiation. This example illustrates low order (e.g., −1, 0, and +1) modes of diffraction. The diffraction grating 402 may be configured to have higher order modes that have larger angles of diffraction (e.g., −2, −1, 0, +1, +2).

Figure 5:
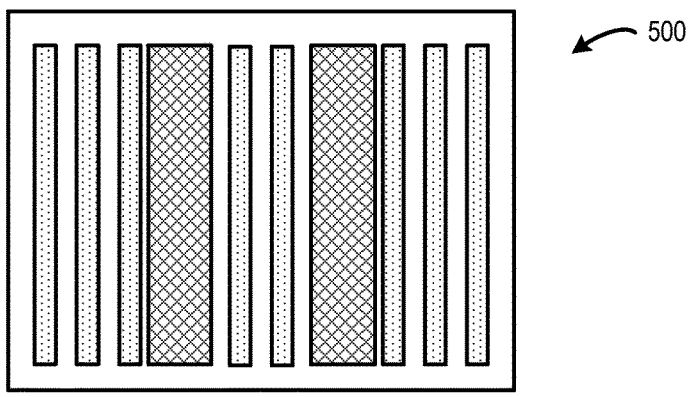
FIG. 5 shows an example implementation of a one-dimensional (1D) diffraction grating.
Figure 6:
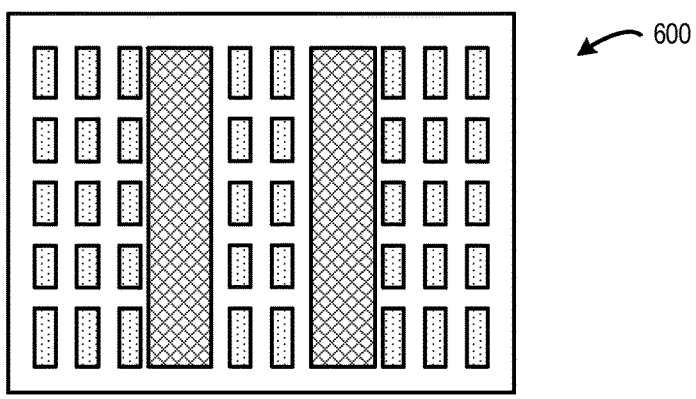
FIG. 6 shows an example implementation of a 2D diffraction grating.

The diffraction grating 402 may be shaped differently in different directions. FIG. 5 shows a top view of an example implementation of a one-dimensional (1D) diffraction grating 500. The diffraction grating 500 may diffract light radiation that strikes the light interface 424 in one orthogonal direction. FIG. 6 shows a top view of an example implementation of a two-dimensional (2D) diffraction grating 600. The diffraction grating 600 may diffract light radiation that strikes the light interface 424 in two orthogonal directions.

Although not shown in FIG. 4, in some implementations, the time-of-flight detector 400 may include a reflector, such as the reflector 218 shown in FIG. 2. In other implementations, the reflector may be omitted.

Figure 7:
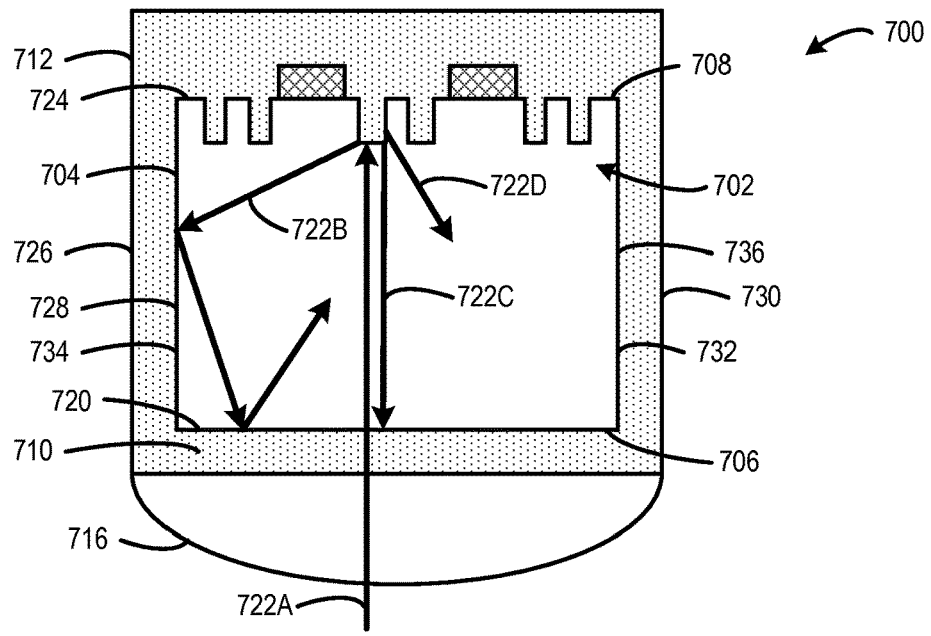
FIG. 7 shows an example time-of-flight detector including diffraction grating and deep trench isolation (DTI).

FIG. 7 shows an example time-of-flight detector 700 including a deep trench isolation (DTI) configuration that may be incorporated into a light modulation structure. Many components of the time-of-flight detector 700 may be substantially the same as those of the time-of-flight detector 400 and are described no further. The features discussed with specific reference to FIG. 7 may be incorporated into the other implementations of this disclosure.

A first deep isolation trench 726 may be formed on a first reflection side 728 of the semiconductor layer 704. A second deep isolation trench 730 may be formed on a second reflection side 732 of the semiconductor layer 704. The first reflection side 728 may be opposite the second reflection side 732. Further, the first reflection side 728 and the second reflection side 732 may be non-parallel to the input side 706 and the detector side 708. In the illustrated example, the first reflection side 728 and the second reflection side 732 are perpendicular to the input side 706 and the detector side 708. The reflection sides 728 and 732 may have any suitable non-parallel angle relative to the input side 706 and/or the detector side 708. The terms "first reflection side" and "second reflection side" are merely differentiating labels and do not necessarily refer to an order in which a light ray is reflected in the semiconductor layer 704.

In the illustrated example, the first and second deep isolation trenches 726, 730 may extend between the input-side dielectric layer 710 and the detector-side dielectric layer 712 to span the entire reflection side 728, 732 of the semiconductor layer 704. In other implementations, the deep isolation trenches 726, 730 may span only a portion of the reflection sides 728, 732 of the semiconductor layer 704. The longer the deep isolation trenches 726, 730 extend along the reflection sides 728, 732 of the semiconductor layer 704 the more optical crosstalk may be inhibited across the time-of-flight detector 700. The deep isolation trenches 726, 730 may have any depth.

The first and second deep isolation trenches 726, 730 may be formed of a dielectric material. In one example, the deep isolation trenches 726, 730 may be formed of the same dielectric material as the input-side dielectric layer 710 and the detector-side dielectric layer 712. Due to the difference in the index of refraction of semiconductor layer 704 and the dielectric material, a light interface 734 may be formed between the first deep isolation trench 726 on the first reflection side 728. Likewise, a light interface 736 may be formed between the second deep isolation trench 730 and the semiconductor layer 704 on the second reflection side 732. The light interfaces 734, 736 may be configured to reflect at least some light radiation through the semiconductor layer 704. In particular, the light interfaces 734, 736 may be configured to totally internally reflect light radiation that strikes the light interfaces 734, 736 at an angle greater than a critical angle of the light interfaces 734, 736. In some implementations, the light interfaces 734, 736 may be configured to have light reflection properties similar or the same as the light interface 720.

In the illustrated example, the time-of-flight detector 700 includes a diffraction grating 702 formed on the detector side 708 of the semiconductor layer 704. The diffraction grating 702 may cooperate with the light interfaces 720, 734, and 736 to create a three dimensional volume in which light radiation that diffracts from the diffraction grating 702 and strikes any of the light interfaces at angle of incidence that is above a critical angle of that light interface experiences total internal reflection. In other words, light radiation may be reflected by any of these light interfaces to increase an interaction path in the semiconductor layer 704.

In the illustrated example, input light radiation (e.g., ray 722A) is initially directed by the optical element 716 through the input-side dielectric layer 710. The light radiation passes through the light interface 720, the semiconductor layer 704, and strikes the light interface 724 of the diffraction grating 702. The light interface 724 diffracts the light radiation into a plurality of different portions (or modes) having different angles. A first portion (e.g., ray 722B) is diffracted at a negative angle relative to an angle of incidence of the input light radiation, a second portion (e.g., 722C) is diffracted at an angle that is normal to the angle of incidence of the input light radiation, and a third portion (e.g., ray 722D) is diffracted at a positive angle relative to an angle of incidence of the input light radiation. Further, the first portion strikes the light interface 734 at an angle greater than the critical angle and is totally internally reflected toward the light interface 720. Further, the first portion strikes the light interface 720 at an angle greater than the critical angle and is totally internally reflected again to extend the interaction path within the semiconductor layer 704.

In some implementations, the time-of-flight detector 700 may include a diffraction grating on the input side 706 of the semiconductor layer 704. In some implementations, the time-of-flight detector 700 may include a reflector coupled to the detector-side dielectric layer 712. Such a reflector may be similar to the reflector 218 shown in FIG. 2.

Figure 8:
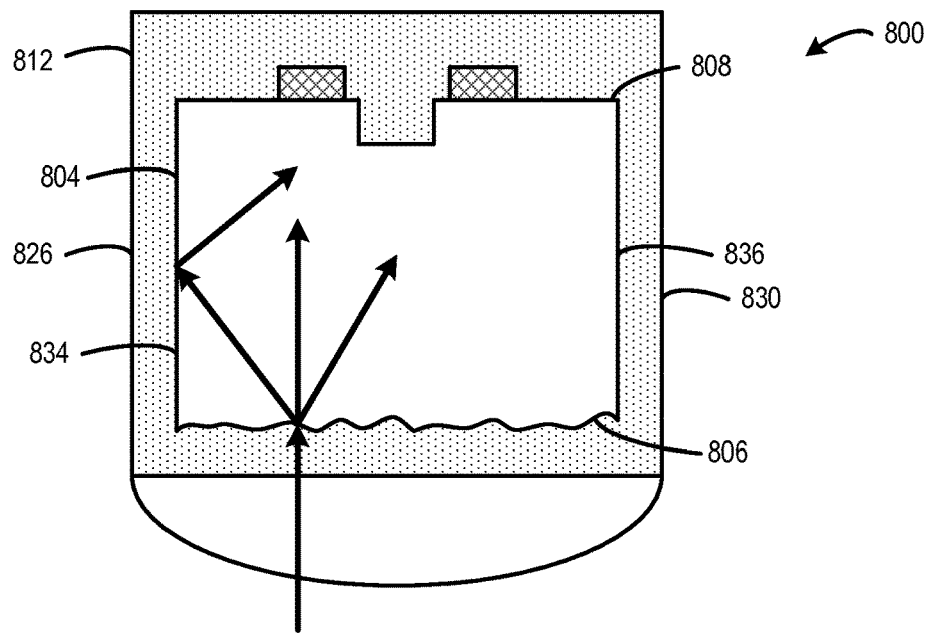
FIG. 8 shows an example time-of-flight detector including surface roughening.

FIG. 8 shows another example time-of-flight detector 800 including a roughened input side of the semiconductor layer and a deep trench isolation (DTI) configuration that may be incorporated into a light modulation structure. Many components of the time-of-flight detector 800 may be substantially the same as those of the time-of-flight detector 700 and are described no further. The features discussed with specific reference to FIG. 8 may be incorporated into the other implementations of this disclosure.

The input side 806 of the semiconductor layer 804 may have a textured or roughened surface that may be configured to scatter light radiation in a variety of angles. In other words, the textured or roughened surface of the input side 806 may be configured to deflect light radiation at an increased angle through the semiconductor layer 804. For example, the textured surface may be idealized by a Lambertian surface. In one example, the input side 806 may be textured using a wet etch process when forming the semiconductor layer 804. In another example, the input side 806 may be textured using a Lithography process when forming the semiconductor layer 804. The textured surface may be formed in any manner.

By scattering the input light radiation, the interaction path of light radiation that traverses the semiconductor layer 804 may be enhanced, thereby increasing QE of the time-of-flight detector 800. Furthermore, in some cases, the light interfaces 834, 836 may totally internally reflect the scattered light radiation to further extend the light interaction path of the scatted light radiation within the semiconductor layer 804.

In some implementations, the detector side 808 of the semiconductor layer 804 may have a textured surface that is configured in the same manner. In other implementations, the time-of-flight detector 800 may include a diffraction grating on the input side 806 and the detector side 808 may include a textured surface. In some implementations, the time-of-flight detector 800 may include a diffraction grating on the detector side 808 and the input side 806 may include a textured surface. In some implementations, the deep oxide trenches 826, 830 may be omitted from the time-of-flight detector 800. In some implementations, the time-of-flight detector 800 may include a reflector coupled to the detector-side dielectric layer 812. Such a reflector may be similar to the reflector 218 shown in FIG. 2.

Figure 9:
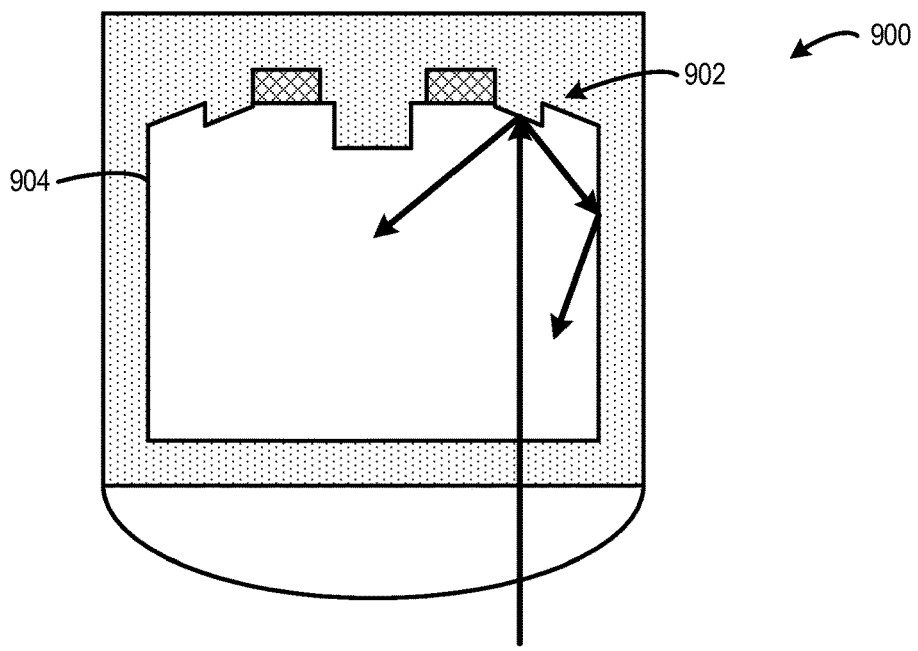
FIG. 9 shows an example time-of-flight detector including a blazed phase grating.

FIG. 9 shows another example time-of-flight detector 900 including a blazed phase grating 902 that may be incorporated into a light modulation structure. The blazed phase grating 902 may be configured to concentrate light radiation in a selected diffraction order while reducing or minimizing light radiation in other orders. Such a grating can be used to direct light radiation in a selected angle with high efficiency and/or to focus light inside the semiconductor layer 904.

Figure 10:
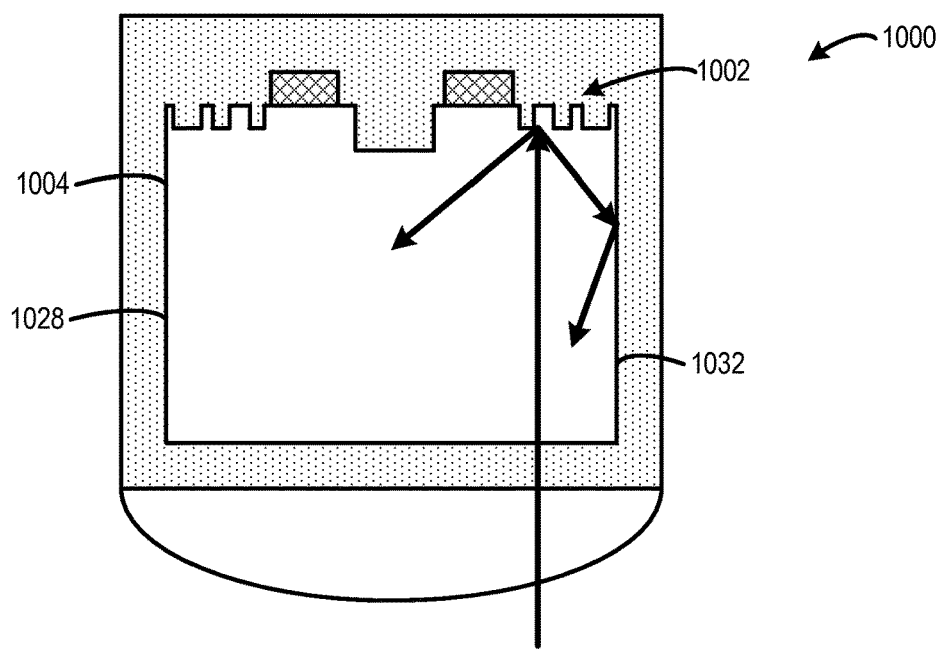
FIG. 10 shows an example time-of-flight detector including a subwavelength grating.

FIG. 10 shows another example time-of-flight detector 1000 including a subwavelength grating 1002 that may be incorporated into a light modulation structure. The subwavelength grating 1002 may include a feature size that is much smaller than a wavelength of light radiation that is directed into the semiconductor layer 1004. Such an optical structure may behave like a homogeneous material whose refractive index is effectively a function of the refractive indexes of the materials that compose the subwavelength grating 1002, and a duty cycle of the subwavelength grating 1002. In one example, the subwavelength grating 1002 may include oxide trenches etched into the semiconductor layer 1004, and the subwavelength grating 1002 may have an increasing trench-trench separation from a center of the semiconductor layer 1004 out to the reflection sides 1028, 1032. Such a configuration may have similar functionality as the blazed phase grating 902.

Many components of the time-of-flight detectors 900, 1000 may be substantially the same as those of the time-of-flight detector 700 and are described no further. The features discussed with specific reference to FIGS. 9 and 10 may be incorporated into the other implementations of this disclosure.

Figure 11:
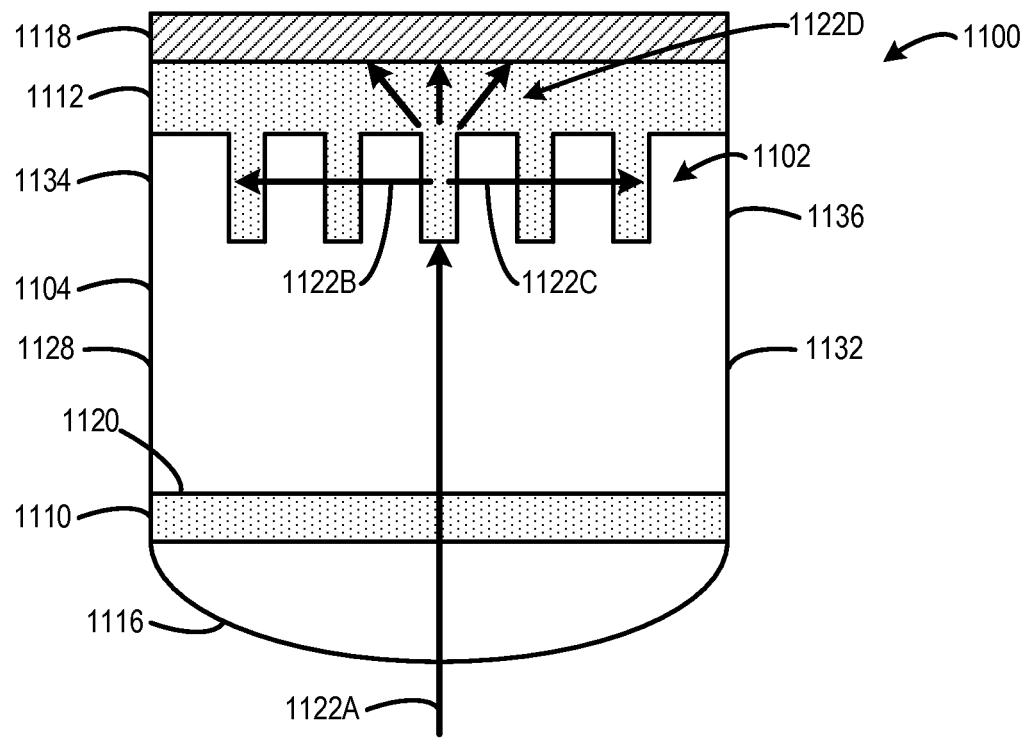
FIG. 11 shows an example time-of-flight detector including a photonic crystal structure.
Figure 12:
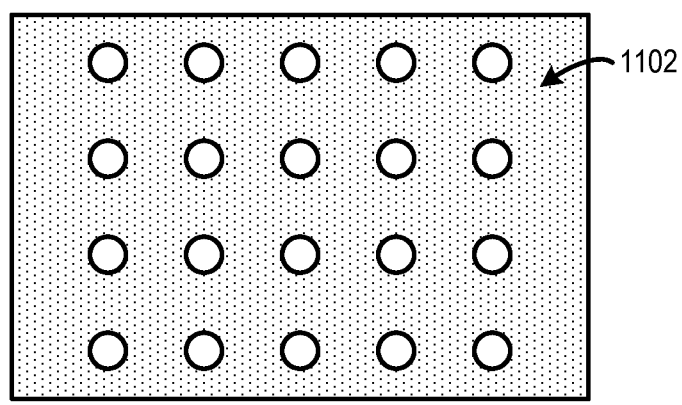
FIG. 12 shows a top view of the photonic crystal structure of FIG. 11.
Figure 13:
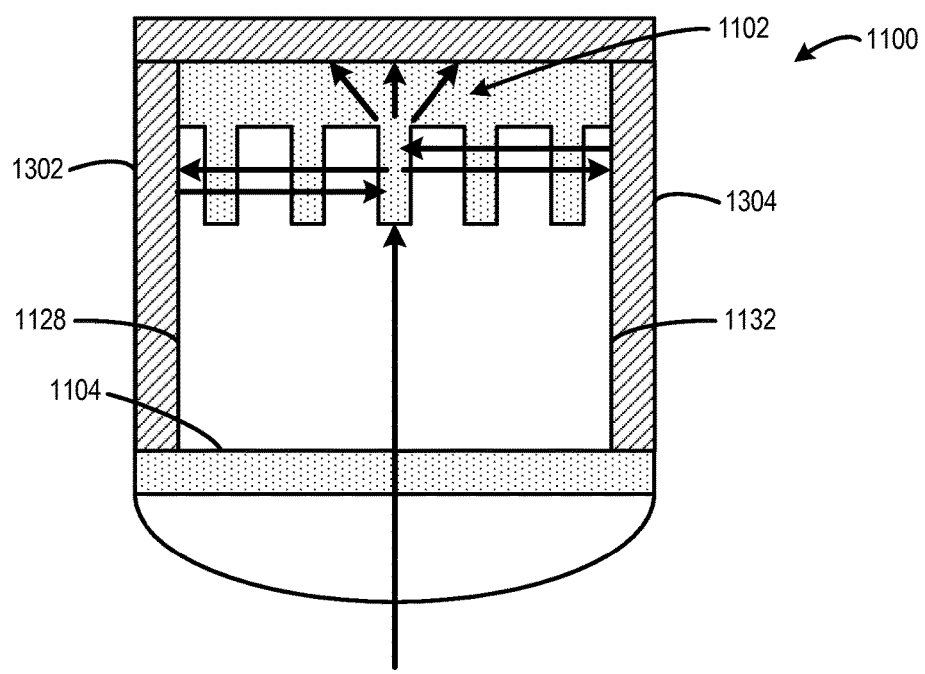
FIG. 13 shows an example photonic crystal structure including reflectors on two reflection sides that may be implemented in a time-of-flight detector.

FIGS. 11-13 show another example time-of-flight detector 1100 including a photonic crystal structure 1102 that may be incorporated into a light modulation structure. The photonic crystal structure 1102 may include a plurality of low-refractive-index material deposits formed in the semiconductor layer 1104. As shown in FIG. 12, the photonic crystal structure 1102 may include a matrix of circular deposits. For example, each deposit may be filled with dielectric material (e.g., the detector-side dielectric layer 1112) that is surrounded by the semiconductor layer 1104. In one particular example, each deposit may include an Oxide material surrounded by Silicon. In some implementations, the plurality of deposit may have a different shape. For example, the plurality of deposit may be rectangular.

The photonic crystal structure 1102 may exhibit a periodic variation in refractive index with a period in the order of a wavelength. Such variation may allow a photonic crystal to modify the propagation of light radiation, such as by allowing certain portions or modes of light radiation to propagate within a plane of the photonic crystal structure, while transmitting or diffracting light radiation in other modes. Furthermore, the photonic crystal structure 1102 may be configured to form a photonic bandgap that can reflect light radiation having a wavelength in the photonic bandgap in the plane of the photonic crystal structure 1102.

Furthermore, light radiation outside of the photonic bandgap can be coupled into quasi-guided modes through the photonic crystal structure 1102. For example, light radiation may be diffracted at an angle such that the light radiation passes through several deposit (and several surrounding layers of the semiconductor layer 1104) before exiting the photonic crystal structure 1102. Upon exiting the photonic crystal structure 1102, light radiation may be reflected back into the photonic crystal structure 1102 by the reflector 1118 to provide a double-pass.

In the illustrated example, input light radiation (e.g., ray 1122A) is initially directed by the optical element 1116 through the input-side dielectric layer 1110. The light radiation passes through the light interface 1120, the semiconductor layer 1104, and strikes the photonic crystal structure 1102. The photonic crystal structure 1102 diffracts the light radiation into a plurality of different portions (or modes) having different angles. As such, first and second portions (e.g., rays 1122B, 1122C) are propagated in a plane of the photonic crystal structure 1102. In particular, the first and second portions of light radiation may be propagated through the different deposits of the photonic crystal structure 1102 such that the first and second portions of light radiation may pass through the segments of the semiconductor layer 1104 that surround the deposit. Further, the photonic crystal structure 1102 may diffract or direct portions (e.g., rays 1122D) of light radiation that are outside the photonic bandgap toward the reflector 1118 to be reflected back into the semiconductor layer 1104. Additionally, the photonic crystal structure 1102 may reflect light waves within the photonic bandgap of the photonic crystal structure 1102 reflected back into the semiconductor layer 1104.

In some implementations, the photonic crystal may be configured to concentrate most of the light radiation of the propagating mode in the high index material, such as Silicon, to further increase the QE of the time-of-flight detector 1100. For example, the time-of-flight detector 1100 may include gratings or textured surfaces as described herein that may be configured to direct light radiation in such a manner.

In some implementations, as shown in FIG. 13, the time-of-flight detector 1100 may include reflectors 1302, 1304 positioned on reflection sides 1128, 1132 of the semiconductor layer 1104. The reflectors 1302, 1304 may be configured to confine propagating modes of light radiation within the plane of the photonic crystal structure 1102. In particular, the reflectors 1302, 1304 may be configured such that once light radiation propagating in the plane of the photonic crystal structure 1102 reaches a reflection side of the semiconductor layer 1104, a reflector may reflect the light radiation back into the photonic crystal structure 1102 in the same plane. Accordingly, the light radiation may take multiple passes through the photonic crystal structure 1102 to increase the QE of the time-of-flight detector 1100.

Any of the herein described light modulation structures may be incorporated, alone or in combination, into a time-of-flight detector to increase a QE of the time-of-flight detector.

Although the light modulation structures are described in the context of a time-of-flight detector, the light modulation structures are broadly applicable to any image sensor. For example, the above described light modulation structures may be implemented in any type of CMOS image sensor.

In an example implementation, an image sensor, comprises a semiconductor layer configured to translate light radiation into electrical charge, and a light modulation structure configured to increase a path of interaction of light radiation through the semiconductor layer. In one example implementation that optionally may be combined with any of the features described herein, the light modulation structure is configured to deflect at least some light radiation at an increased angle through the semiconductor layer. In one example implementation that optionally may be combined with any of the features described herein, the light modulation structure is configured to reflect light radiation more than once through the semiconductor layer. In one example implementation that optionally may be combined with any of the features described herein, the semiconductor layer includes an input side having a light interface and a detector side opposite the input side, wherein the light modulation structure includes a reflector positioned on the detector side of the semiconductor layer, wherein the reflector is configured to reflect light radiation that passes through the semiconductor layer back into the semiconductor layer, and wherein at least some light radiation resonates between the reflector and the light interface. In one example implementation that optionally may be combined with any of the features described herein, the reflector is a first reflector, wherein the light modulation structure includes a second reflector positioned on the input side of the semiconductor layer, wherein the second reflector includes a plurality of layers including alternating layers of a first material having a first refractive index and a second material having a second refractive index lower than the first refractive index, and wherein the at least some light radiation resonates between the first reflector and the second reflector. In one example implementation that optionally may be combined with any of the features described herein, the light modulation structure includes a diffraction grating configured to form a light interface with the semiconductor layer, and wherein the light interface has an index of refraction that varies according to a spatial period along the light interface. In one example implementation that optionally may be combined with any of the features described herein, the semiconductor layer includes an input side, a detector side opposite the input side, and one or more reflection sides non-parallel to the input side and the detector side, wherein the light modulation structure includes a dielectric layer formed on at least a portion of the one or more reflection sides, wherein the dielectric layer is configured to form a light interface with the semiconductor layer, and wherein the light interface is configured to reflect at least some light radiation through the semiconductor layer. In one example implementation that optionally may be combined with any of the features described herein, the light modulation structure includes a subwavelength grating configured to form a light interface with the semiconductor layer, wherein the subwavelength grating includes a plurality of light modulation features that are smaller than a selected wavelength of light radiation, wherein the light interface has an index of refraction that is a function of a ratio of a refractive index of the semiconductor layer and a refractive index of the subwavelength grating, and a structure of the plurality of light modulation features of the subwavelength grating.

In one example implementation that optionally may be combined with any of the features described herein, the light modulation structure includes a photonic crystal including a periodic array of low-refractive-index-material deposits aligned in a same plane, wherein each low-refractive-index-material deposit is surrounded by the semiconductor layer, and wherein each low-refractive-index-material deposit is configured to deflect at least some light radiation into the plane. In one example implementation that optionally may be combined with any of the features described herein, the semiconductor layer includes germanium.

In another example implementation, a time-of-flight detector, comprises a semiconductor layer configured to translate light radiation into electrical charge, the semiconductor layer including an input side having a light interface and a detector side opposite the input side, an optical element positioned on the input side of the semiconductor layer and configured to direct light radiation through the light interface; and a reflector positioned on the detector side of the semiconductor layer, the reflector being configured to reflect light radiation that passes through the semiconductor layer back into the semiconductor layer, and wherein at least some light radiation resonates between the reflector and the light interface. In one example implementation that optionally may be combined with any of the features described herein, the reflector is a first reflector, and wherein the time-of-flight detector further comprises a second reflector positioned on the input side of the semiconductor layer, wherein the second reflector includes an interface between the semiconductor layer and another layer having a different refractive index than the semiconductor layer. In one example implementation that optionally may be combined with any of the features described herein, the reflector is a first reflector, and wherein the time-of-flight detector further comprises a second reflector positioned on the input side of the semiconductor layer, wherein the second reflector includes a plurality of layers including alternating layers of a first material having a first refractive index and a second material having a second refractive index lower than the first refractive index, and wherein the at least some light radiation resonates between the first reflector and the second reflector. In one example implementation that optionally may be combined with any of the features described herein, the time-of-flight detector further comprises a diffraction grating positioned on the detector side, intermediate the semiconductor layer and the reflector, the diffraction grating being configured to form a light interface with the semiconductor layer, and wherein the light interface has an index of refraction that varies according to a spatial period along the light interface. In one example implementation that optionally may be combined with any of the features described herein, the semiconductor layer includes one or more reflection sides non-parallel to the input side and the detector side, and wherein the time-of-flight detector further comprises; a dielectric layer formed on at least a portion of the one or more reflection sides, wherein the dielectric layer is configured to form a light interface with the semiconductor layer, and wherein the light interface is configured to reflect at least some light radiation through the semiconductor layer. In one example implementation that optionally may be combined with any of the features described herein, the time-of-flight detector further comprises a subwavelength grating positioned on the input side, intermediate the optical element and the semiconductor layer, the subwavelength grating including a plurality of light modulation features that are smaller than a selected wavelength of light radiation, the subwavelength grating being configured to form a light interface with the semiconductor layer, the light interface having an index of refraction that is a function of a ratio of a refractive index of the semiconductor layer and a refractive index of the subwavelength grating, and a structure of the plurality of light modulation features of the subwavelength grating. In one example implementation that optionally may be combined with any of the features described herein, the time-of-flight detector further comprises a photonic crystal positioned on the detector side, the photonic crystal including a periodic array of low-refractive-index-material deposits being aligned in a same plane, each low-refractive-index-material deposit being surrounded by the semiconductor layer, and wherein each low-refractive-index-material deposit is configured to deflect at least some light radiation into the plane.

In another example implementation, a time-of-flight detector, comprises a semiconductor layer configured to translate light radiation into electrical charge, an optical element configured to direct light radiation through the semiconductor layer, and a light modulation structure formed on at least three reflection sides of the semiconductor layer, at least a portion of each reflection side forming a light interface with the semiconductor layer, the light interface being configured to reflect at least some light radiation into the semiconductor layer. In one example implementation that optionally may be combined with any of the features described herein, the semiconductor layer includes an input side having a light interface and a detector side opposite the input side, wherein the light modulation structure includes a reflector positioned on the detector side of the semiconductor layer, wherein the reflector is configured to reflect light radiation that passes through the semiconductor layer back into the semiconductor layer, and wherein at least some light radiation resonates between the reflector and the light interface. In one example implementation that optionally may be combined with any of the features described herein, the semiconductor layer includes an input side, a detector side opposite the input side, and one or more reflection sides non-parallel to the input side and the detector side, wherein the light modulation structure includes a dielectric layer formed on at least a portion of the one or more reflection sides, wherein the dielectric layer is configured to form a light interface with the semiconductor layer, and wherein the light interface is configured to reflect at least some light radiation through the semiconductor layer.

It will be understood that the configurations and/or approaches described herein are exemplary in nature, and that these specific implementations or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A time-of-flight detector tuned to a time-of-flight illumination source configured to emit illumination light within a designated wavelength range, the time-of-flight detector comprising:
    a semiconductor layer configured to translate a light radiation from the illumination light into electrical charge, the semiconductor layer including an input side having a light interface, and a detector side opposite the input side;
    an optical element positioned on the input side of the semiconductor layer and configured to direct the light radiation through the light interface; and
    a reflector positioned on the detector side of the semiconductor layer, the reflector being configured to reflect the light radiation that passes through the semiconductor layer back into the semiconductor layer, and wherein the semiconductor layer, the optical element and the reflector are tuned to control a path length of the light radiation to resonate between the reflector and the light interface along a path that is normal to the input side and the detector side and thereby constructively interfere within the designated wavelength range.

2. The time-of-flight detector of claim 1, wherein the reflector is a first reflector, and wherein the time-of-flight detector further comprises:
    a second reflector positioned on the input side of the semiconductor layer, wherein the second reflector includes an interface between the semiconductor layer and another layer having a different refractive index than the semiconductor layer.

3. The time-of-flight detector of claim 1, wherein the reflector is a first reflector, and wherein the time-of-flight detector further comprises:
    a second reflector positioned on the input side of the semiconductor layer, wherein the second reflector includes a plurality of layers including alternating layers of a first material having a first refractive index and a second material having a second refractive index lower than the first refractive index, and wherein the at least some light radiation resonates between the first reflector and the second reflector.

4. The time-of-flight detector of claim 1, further comprising:
    a diffraction grating positioned on the detector side, intermediate the semiconductor layer and the reflector, the diffraction grating being configured to form a light interface with the semiconductor layer and to increase a bandwidth of resonating light radiation, and wherein the light interface has an index of refraction that varies according to a spatial period along the light interface.

5. The time-of-flight detector of claim 1, further comprising:
    a subwavelength grating positioned on the input side, intermediate the optical element and the semiconductor layer, the subwavelength grating including a plurality of light modulation features that are smaller than a selected wavelength of light radiation, the subwavelength grating being configured to form a light interface with the semiconductor layer, the light interface having an index of refraction that is a function of a ratio of a refractive index of the semiconductor layer and a refractive index of the subwavelength grating, and a structure of the plurality of light modulation features of the subwavelength grating.

6. The time-of-flight detector of claim 1, wherein the semiconductor layer, the optical element, and the reflector have a thickness and a refractive index that controls the path length for resonance and constructive interference.

7. The time-of-flight detector of claim 1, wherein the semiconductor layer includes one or more reflection sides non-parallel to the input side and the detector side, and wherein the time-of-flight detector further comprises a dielectric layer formed on at least a portion of the one or more reflection sides, wherein the dielectric layer is configured to form a light interface with the semiconductor layer, and wherein the light interface is configured to reflect at least some of the light radiation through the semiconductor layer.

8. The time-of-flight detector of claim 1, wherein the semiconductor layer includes germanium.

9. A time-of-flight detector tuned to a time-of-flight illumination source configured to emit illumination light within a designated wavelength range, the time-of-flight detector comprising:
   a semiconductor layer configured to translate a light radiation from the illumination light into electrical charge;
   an optical element configured to direct the light radiation through the semiconductor layer; and
   a light modulation structure formed on at least three reflection sides of the semiconductor layer, wherein the light modulation structure is tuned to control a path length of the light radiation to resonate between two of the at least three reflection sides of the light modulation structure along a path that is normal to the two of the at least three reflection sides and thereby constructively interfere within the designated wavelength range.

10. The time-of-flight detector of claim 9, wherein the semiconductor layer includes an input side having a light interface and a detector side opposite the input side, wherein the light modulation structure includes a reflector positioned on the detector side of the semiconductor layer, wherein the reflector is configured to reflect light radiation that passes through the semiconductor layer back into the semiconductor layer, and wherein at least some light radiation resonates between the reflector and the light interface.

11. The time-of-flight detector of claim 9, wherein the light modulation structure has a thickness and a refractive index that controls the path length for resonance and constructive interference.

12. The time-of-flight detector of claim 9, wherein the light modulation structure includes a plurality of layers positioned on at least one of the at least three reflection sides, the plurality of layers including alternating layers of a first material having a first refractive index and a second material having a second refractive index lower than the first refractive index.

13. The time-of-flight detector of claim 9, wherein the light modulation structure includes a diffraction grating configured to increase a bandwidth of resonating light radiation.

14. The time-of-flight detector of claim 9, wherein the light modulation structure includes a subwavelength grating configured to form a light interface with the semiconductor layer, wherein the subwavelength grating includes a plurality of light modulation features that are smaller than a selected wavelength of light radiation.

15. The time-of-flight detector of claim 9, wherein the light modulation structure includes a dielectric layer formed on at least a portion of at least one of the three or more reflection sides, wherein the dielectric layer is configured to form a light interface with the semiconductor layer, and wherein the light interface is configured to reflect at least some light radiation through the semiconductor layer.

16. The time-of-flight detector of claim 9, wherein the semiconductor layer includes germanium.

17. A time-of-flight detector tuned to a time-of-flight illumination source configured to emit illumination light within a designated wavelength range, the time-of-flight detector comprising:
   a semiconductor layer configured to translate a light radiation from the illumination light into electrical charge, the semiconductor layer including an input and a detector side opposite the input side;
   a first reflector positioned on the input side of the semiconductor layer, wherein the first reflector has a different refractive index than the semiconductor layer such that a light interface is formed between the semiconductor layer and first reflector;
   an optical element positioned on the input side of the semiconductor layer and configured to direct the light radiation through the light interface; and
   a second reflector positioned on the detector side of the semiconductor layer, the second reflector being configured to reflect the light radiation that passes through the semiconductor layer back into the semiconductor layer, and wherein the semiconductor layer, the optical element, the first reflector, and the second reflector are tuned to control a path length of the light radiation to resonate between the first reflector and the light interface along a path that is normal to the input side and the detector side and thereby constructively interfere within the designated wavelength range.

18. The time-of-flight detector of claim 17, wherein the light interface is a first light interface, and where the time-of-flight detector further comprises a diffraction grating positioned on the detector side, intermediate the semiconductor layer and the second reflector and configured to increase a bandwidth of resonating light radiation.

19. The time-of-flight detector of claim 17, further comprising:
   a subwavelength grating positioned on the input side, intermediate the optical element and the semiconductor layer, the subwavelength grating including a plurality of light modulation features that are smaller than a selected wavelength of light radiation.

20. The time-of-flight detector of claim 17, wherein the light interface is a first light interface, wherein the semiconductor layer includes one or more reflection sides non-parallel to the input side and the detector side, wherein the time-of-flight detector further comprises a dielectric layer formed on at least a portion of the one or more reflection sides, wherein the dielectric layer is configured to form a second light interface with the semiconductor layer, and wherein the second light interface is configured to reflect at least some of the light radiation through the semiconductor layer.

* * * * *